(12) United States Patent
Mori et al.

(10) Patent No.: US 12,379,422 B2
(45) Date of Patent: Aug. 5, 2025

(54) INSULATION RESISTANCE TESTING DEVICE AND INSULATION RESISTANCE TESTING METHOD

(71) Applicant: TOYOTA JIDOSHA KABUSHIKI KAISHA, Toyota (JP)

(72) Inventors: Shinichiro Mori, Nisshin (JP); Naoya Hatakeyama, Toyota (JP); Hidenori Matsutoh, Toyota (JP); Takuro Fuchigami, Kasugai (JP); Tsutomu Kawasaki, Toyota (JP); Yuki Matsui, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 168 days.

(21) Appl. No.: 18/454,274

(22) Filed: Aug. 23, 2023

(65) Prior Publication Data
US 2024/0110991 A1   Apr. 4, 2024

(30) Foreign Application Priority Data

Sep. 30, 2022 (JP) .................................. 2022-158354
Mar. 22, 2023 (JP) .................................. 2023-045541

(51) Int. Cl.
*G01R 31/385*   (2019.01)
*G01R 31/389*   (2019.01)

(52) U.S. Cl.
CPC ......... *G01R 31/389* (2019.01); *G01R 31/385* (2019.01)

(58) Field of Classification Search
CPC ............................ G01R 31/389; G01R 31/385
USPC .............. 324/500, 600, 76.11, 551, 425–434
See application file for complete search history.

(56) References Cited

U.S. PATENT DOCUMENTS

| | | | |
|---|---|---|---|
| 8,570,047 B1* | 10/2013 | Davies .................. | H02J 7/0019 324/426 |
| 9,069,024 B2* | 6/2015 | Yang ..................... | G01R 27/025 |
| 2014/0191720 A1* | 7/2014 | Sugiyama ............. | H02J 7/1423 320/109 |
| 2019/0260095 A1* | 8/2019 | Machida ................ | H02J 7/04 |
| 2020/0313248 A1* | 10/2020 | Choi ..................... | G01R 31/386 |
| 2022/0034972 A1* | 2/2022 | Wang ................... | G01R 31/382 |
| 2022/0276308 A1* | 9/2022 | Kawaguchi .......... | H01R 11/283 |

FOREIGN PATENT DOCUMENTS

| | | |
|---|---|---|
| JP | 2014-154293 A | 8/2014 |
| JP | 2017-75929 A | 4/2017 |

* cited by examiner

*Primary Examiner* — Raul J Rios Russo
*Assistant Examiner* — Trung Q Nguyen
(74) *Attorney, Agent, or Firm* — Oblon, McClelland, Maier & Neustadt, L.L.P.

(57) ABSTRACT

The insulation resistance testing device of the present disclosure includes a first magnetic current sensor disposed between the control unit and the ground, and a first damping resistor disposed in series with the first magnetic current sensor between the control unit and the ground. The insulation resistance testing device of the present disclosure includes a second magnetic current sensor disposed between the positive terminal and the ground of the battery pack, and a second damping resistor disposed in series with the second magnetic current sensor between the positive terminal and the ground.

4 Claims, 6 Drawing Sheets

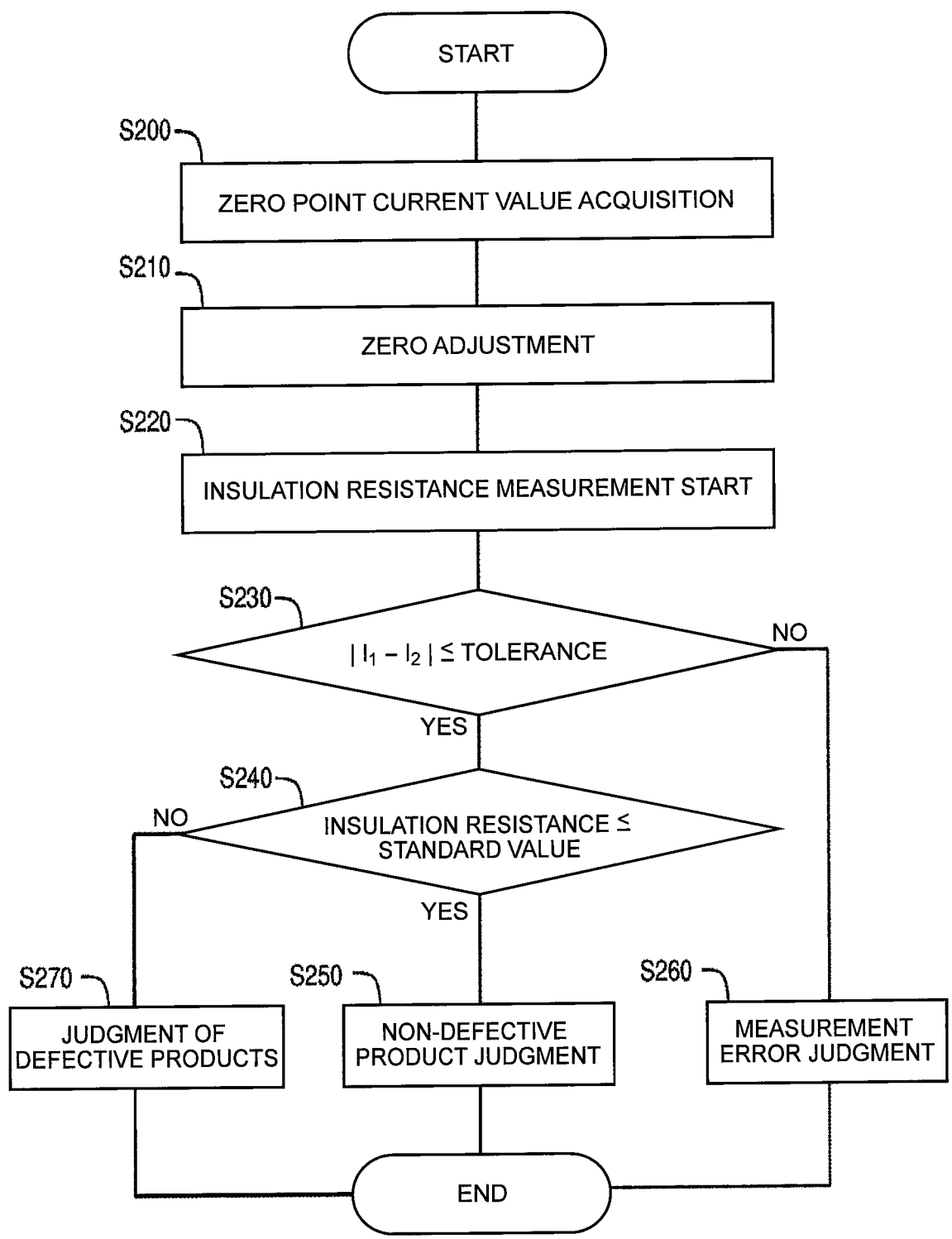

INSULATION RESISTANCE TESTING DEVICE AND INSULATION RESISTANCE TESTING METHOD

CROSS-REFERENCE TO RELATED APPLICATION

This application claims priority to Japanese Patent Application No. 2022-158354 filed on Sep. 30, 2022 and Japanese Patent Application No. 2023-045541 filed on Mar. 22, 2023, each incorporated herein by reference in its entirety.

BACKGROUND

1. Technical Field

The present disclosure relates to a device and a method for testing an insulation resistance of a battery pack provided with a control unit including an electrolytic capacitor.

2. Description of Related Art

When a battery pack is shipped, an insulation resistance of the battery pack is tested. For example, as disclosed in Japanese Unexamined Patent Application Publication No. 2017-075929 (JP 2017-075929 A), conventionally, a method has been used in which resistors are connected between an assembled battery and a pack body that houses the assembled battery, and the insulation resistance is tested based on a voltage difference between the resistors.

However, the conventional method of testing the insulation resistance has an issue that it takes time to test. This is because a control unit that controls an output of the battery pack is incorporated in a circuit of the battery pack. Since the control unit includes an electrolytic capacitor, an insulation resistance value calculated from a voltage difference continues to change until an electric charge accumulates in the electrolytic capacitor. It takes a certain amount of time until the electric charge fully accumulates in the electrolytic capacitor and the insulation resistance value stabilizes, which leads to prolongation of the testing time.

SUMMARY

The present disclosure has been made in view of the above issue. One object of the present disclosure is to enable an insulation resistance of a battery pack provided with a control unit including an electrolytic capacitor to be quickly tested.

The present disclosure provides an insulation resistance testing device for achieving the above object. In one embodiment of the present disclosure, an insulation resistance testing device includes: a first magnetic current sensor disposed between the control unit and a ground; and a first damping resistor disposed in series with a first magnetic current sensor between the control unit and the ground. Further, the insulation resistance testing device includes: a second magnetic current sensor disposed between a positive terminal of the battery pack and the ground; and a second damping resistor disposed in series with a second magnetic current sensor between the positive terminal of the battery pack and the ground.

The resistance value of the insulation resistance of the battery pack can be calculated based on the voltage value of the battery pack, the current value (first current value) of the current flowing between the control unit and the ground, and the current value (second current value) of the current flowing between the positive terminal of the battery pack and the ground. According to the above embodiment, the current value of the current flowing between the control unit and the ground is measured by the first magnetic current sensor, and the current value of the current flowing between the positive terminal of the battery pack and the ground is measured by the second magnetic current sensor. However, the magnetic current sensor is easily responsive to a magnetic field generated in an external environment. Therefore, by simply mounting the magnetic current sensor, there is a possibility that a deviation from the zero point in the output value of the magnetic current sensor arises despite the zero point adjustment. The deviation from the zero point in the output value causes an error in the measured value of the insulation resistance.

In this regard, in the above embodiment, the damping resistor is disposed in series with each magnetic current sensor. The magnetic current sensor has an advantage in that the resistance is unnecessary and a power loss is smaller than that of a resistive current sensor. However, by disposing the damping resistor intentionally, it is possible to suppress the current from flowing due to the external magnetic field. Therefore, according to the above-described embodiment, an accurate current value corresponding to the resistance value of the true insulation resistance of the battery pack can be obtained from each magnetic current sensor.

An insulation resistance testing method according to an embodiment of the present disclosure is a method for testing an insulation resistance of a battery pack using the above-described insulation resistance testing device. The insulation resistance testing method includes: performing a zero point adjustment of the first magnetic current sensor; and performing a zero point adjustment of the second magnetic current sensor. Since the damping resistor is disposed in series with each magnetic current sensor, the zero-point adjustment can be performed accurately. Further, the insulation resistance testing method includes: acquiring a first current value measured by the first magnetic current sensor; and acquiring a second current value measured by the second magnetic current sensor. Since the current value acquired from each magnetic current sensor does not include an influence by the electrolytic capacitor, the current value can be acquired without having to wait for a certain period of time. Then, the insulation resistance testing method includes calculating a resistance value of the insulation resistance of the battery pack based on a voltage value of the battery pack, the first current value, and the second current value. According to such a method, since the resistance value of the insulation resistance can be accurately acquired without waiting for a certain period of time after the voltage of the battery pack is applied, the time required for testing the insulation resistance of the battery pack can be shortened.

In an insulation resistance testing device according to another embodiment of the present disclosure, the first magnetic current sensor is configured as a first set of a plurality of magnetic current sensors arranged in series. Further, the second magnetic current sensor is configured as a second set of a plurality of magnetic current sensors arranged in series. According to this, it is possible to guarantee the measurement accuracy of the current value by performing the mutual comparison of the power values between the magnetic current sensors constituting the set.

An insulation resistance testing method according to another embodiment of the present disclosure is a method for testing an insulation resistance of a battery pack using the above-described insulation resistance testing device. The insulation resistance testing method includes: performing a zero point adjustment of each of the magnetic current sensors constituting the first set; and performing a zero point adjustment of each of the magnetic current sensors constituting the second set. The insulation resistance testing method includes acquiring a first current value representing a current value measured by the magnetic current sensors constituting the first set when an error among current values measured by the magnetic current sensors constituting the first set is within a range of an allowable error. Further, the insulation resistance testing method includes acquiring a second current value representing a current value measured by the magnetic current sensors constituting the second set when an error among current values measured by the magnetic current sensors constituting the second set is within a range of an allowable error. Then, the insulation resistance testing method includes calculating a resistance value of the insulation resistance of the battery pack based on a voltage value of the battery pack, the first current value, and the second current value. That is, according to the insulation resistance testing method, as a result of the mutual comparison of the power values between the magnetic current sensors constituting the first set, the insulation resistance is tested using the first current value only when it is confirmed that there is no abnormality. Further, as a result of the mutual comparison of the power values between the magnetic current sensors constituting the second set, the insulation resistance is tested using the second current value only when it is confirmed that there is no abnormality. According to such a method, it is possible to improve the testing accuracy of the insulation resistance while shortening the time required for testing the insulation resistance of the battery pack.

As described above, the present disclosure provides an insulation resistance testing device and an insulation resistance testing method capable of quickly testing the insulation resistance of a battery pack provided with a control unit including an electrolytic capacitor. According to the present disclosure, it is possible to shorten the time required for testing the insulation resistance of the battery pack.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 6 is a flowchart showing a procedure of an insulation resistance testing method using an insulation resistance testing device including a current sensor unit according to a second embodiment.

DETAILED DESCRIPTION OF EMBODIMENTS

Figure 1A:
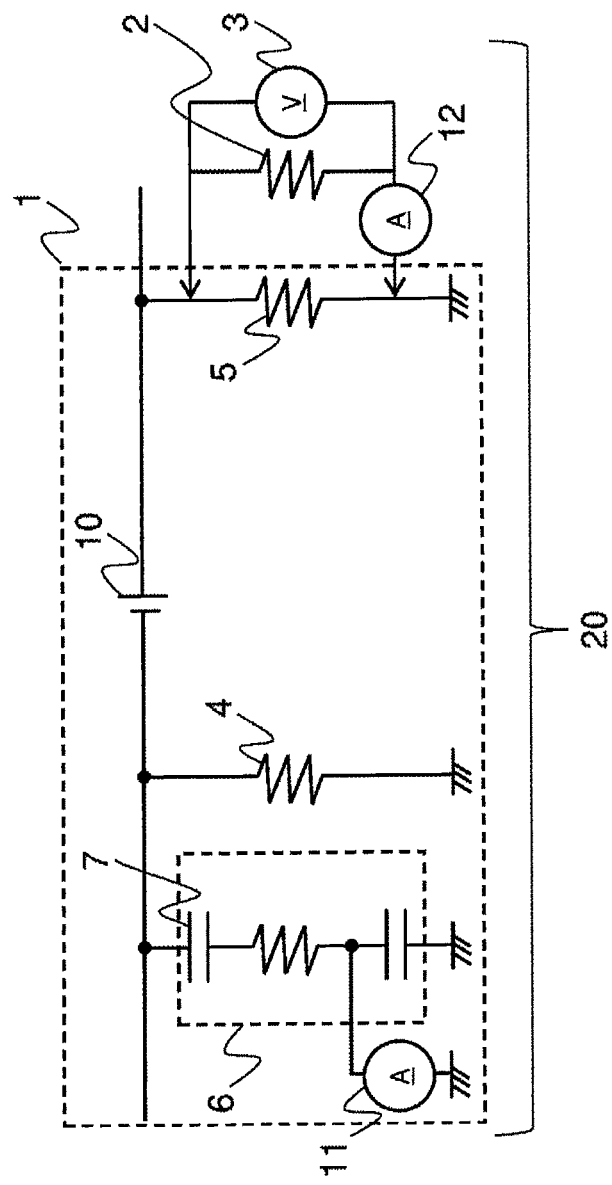
FIG. 1A is a circuit diagram of a battery pack equipped with an insulation resistance testing device.

FIG. 1A is a circuit diagram of a battery pack 1 to which an insulation resistance testing device 20 according to an embodiment of the present disclosure is attached. The battery pack 1 to be inspected by the insulation resistance testing device 20 includes an assembled battery 10 in which a plurality of unit cells are connected, and a control unit 6 having an electrolytic capacitor 7 therein. Further, the battery pack 1 includes an insulation resistance 4 on the side of the negative terminal of the assembled battery 10, and an insulation resistance 5 on the side of the positive terminal of the assembled battery 10.

The insulation resistance testing device 20 includes a detection resistor 2 provided between the positive terminal and the ground, and a voltmeter 3 that measures a voltage applied to the detection resistor 2. The detection resistor 2 is connected in parallel to the insulation resistance 5. Further, the insulation resistance testing device 20 includes a first current sensor unit 11 for measuring a current value (first current value) of a current flowing between the control unit 6 and the ground, and a second current sensor unit 12 for measuring a current value (second current value) of a current flowing through the detection resistor 2. By using the insulation resistance testing device 20 configured as described above, the insulation resistance of the battery pack 1 is inspected by the following method.

In the inspection of the insulation resistance using the insulation resistance testing device 20, the resistance value of the insulation resistance 4 on the negative terminal side is calculated. The resistance value of the insulation resistance 4 can be used as an evaluation index of the insulation resistance of the battery pack 1. The resistance value of the insulation resistance 4 is calculated by a system (hereinafter referred to as an insulation resistance inspection system) that executes an insulation resistance testing method. However, the resistance value may be calculated by the inspector.

As the information used for calculating the resistance value of the insulation resistance 4, the insulation resistance inspection system acquires the voltage value of the assembled battery 10. The voltage value may be a steady voltage value specified in advance, or may be a value measured by a measuring instrument. The measurement by the measuring instrument may be performed by an inspector, or may be performed by a voltmeter different from the voltmeter 3 provided in the battery pack 1. Further, the insulation resistance inspection system acquires the voltage value of the voltage applied to the detection resistor 2 from the voltmeter 3. Furthermore, the insulation resistance testing system obtains a first current value by means of the first current sensor unit 11 and a second current value by means of the second current sensor unit 12. The first current value and the second current value are used for calculating the resistance value of the insulation resistance 4 together with the voltage value obtained from the voltmeter 3.

Figure 2:
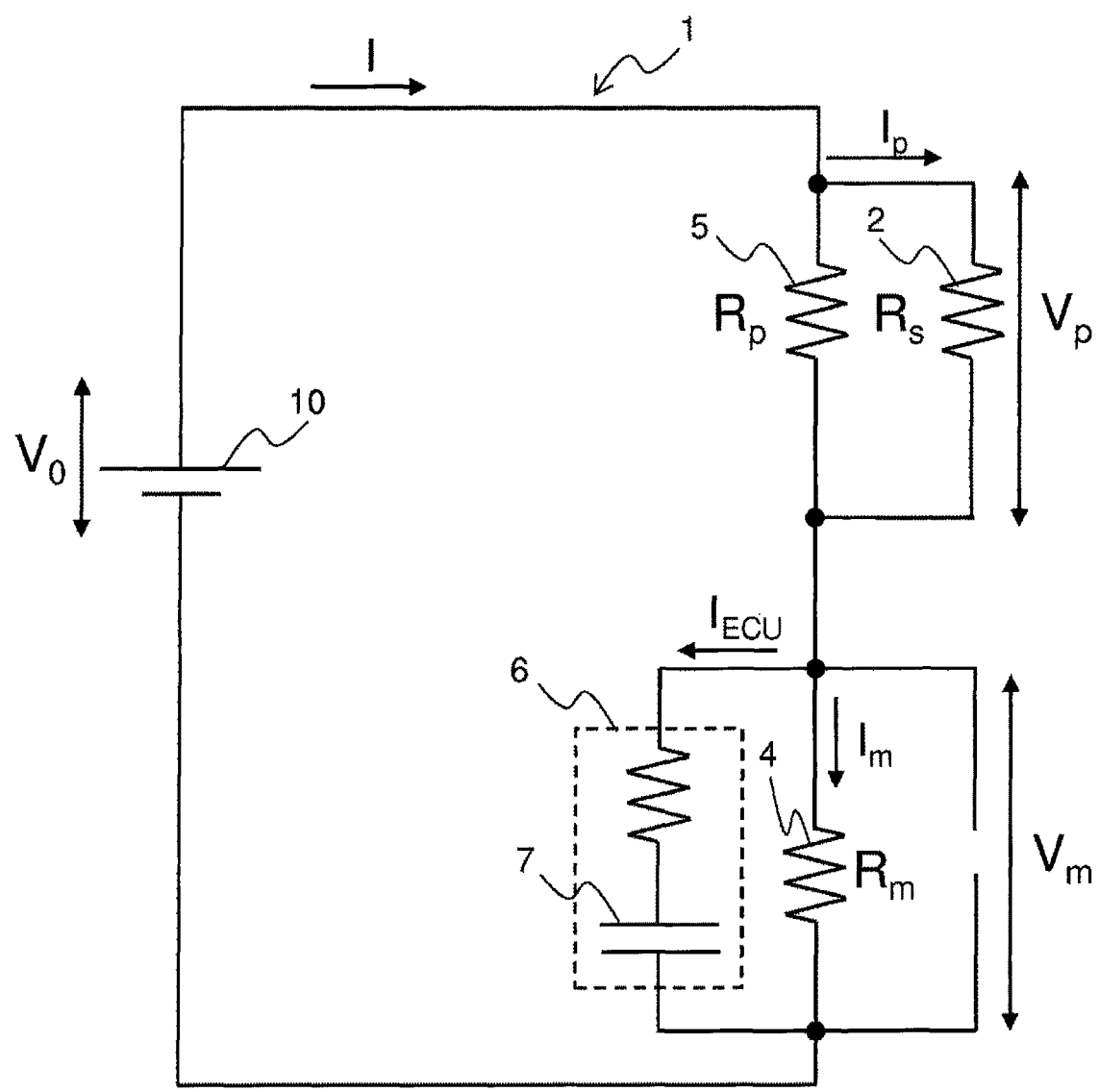
FIG. 2 is a circuit diagram of an equivalent circuit at the time of inspecting the insulation resistance of a battery pack to which an insulation resistance testing device is attached.

FIG. 2 is a circuit diagram of an equivalent circuit at the time of inspecting the insulation resistance of the battery pack 1 to which the insulation resistance testing device 20 is attached. Hereinafter, a method of calculating the resistance value of the insulation resistance 4 will be described with reference to FIG. 2.

The current flowing through the entire circuit of the battery pack 1 branches into a current flowing through the control unit 6 and a current flowing through the insulation resistance 4 on the negative terminal side. Therefore, the current value $I_m$ of the current flowing through the insulation resistance 4 can be expressed as the difference between the current value I of the current flowing through the entire circuit and the current value $I_{ECU}$ of the current flowing through the control unit 6, that is, the first current value.

The current value I can be expressed by $(1+R_s/R_p) \times I_p$ using the current value $I_p$ (second current value) of the current flowing through the detection resistor 2, the resistance value $R_p$ of the insulation resistance 5 on the positive terminal side, and the resistance value $R_s$ of the detection resistor 2. In order to increase the safety factor as a whole of the battery pack 1, a minimum value satisfying the standard value of the insulation resistance is used as the resistance value $R_p$ of the insulation resistance 5. The maximum value of the tolerance range with respect to the nominal value is used as the resistance value $R_s$ of the detection resistor 2. The voltage $V_m$ applied to the insulation resistance 4 on the negative terminal side can be expressed as a difference between the voltage $V_0$ applied to the assembled battery 10 and the voltage $V_p$ applied to the detection resistor 2.

Using the above relationship, the resistance value $R_m$ of the insulation resistance 4 on the negative terminal side can be expressed by the following equation. The insulation resistance inspection system calculates a resistance value $R_m$ by substituting a measured value or an assumed value into the following equation. Whether or not the resistance value $R_m$ calculated in this way is within the range of the standard value can be determined whether or not an abnormality has occurred in the insulation resistance.

$$R_m = (V_0 - V_p) / \{(1 + R_s/R_p) \times I_p - I_{ECU}\}$$

In the conventional insulation resistance testing method, the insulation resistance 4 on the negative terminal side of the battery pack 1 is inspected based on the voltage across the detection resistor 2 measured by the voltmeter 3. However, as indicated by a dotted line in FIG. 1B, the voltage across the detection resistor 2 is reduced by the time due to the effect of the electrolytic capacitor 7. Moreover, a variation occurs in the time until the voltage changes to a constant level. That is, the conventional inspection method requires a long time to inspect the insulation resistance, and there is a large variation in the time required for the inspection.

Figure 1B:
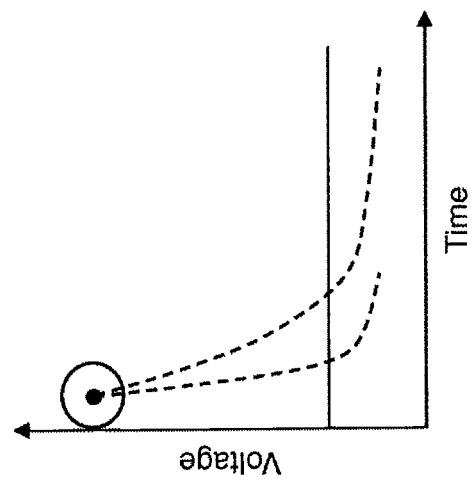
FIG. 1B is a graph illustrating the characteristics of an insulation resistance testing device.

However, according to the inspection of the insulation resistance using the insulation resistance testing device 20, it is not required to follow the change with time of the voltage applied to the detection resistor 2, as surrounded by a circle in the chart FIG. 1B, it is possible to terminate the measurement at the time when the voltage value can be acquired. That is, by using the insulation resistance testing device 20, it is possible to eliminate the influence of the state of charge of the electrolytic capacitor 7, it is possible to shorten the time for inspecting the insulation resistance as compared with the conventional inspection method.

Figure 3:
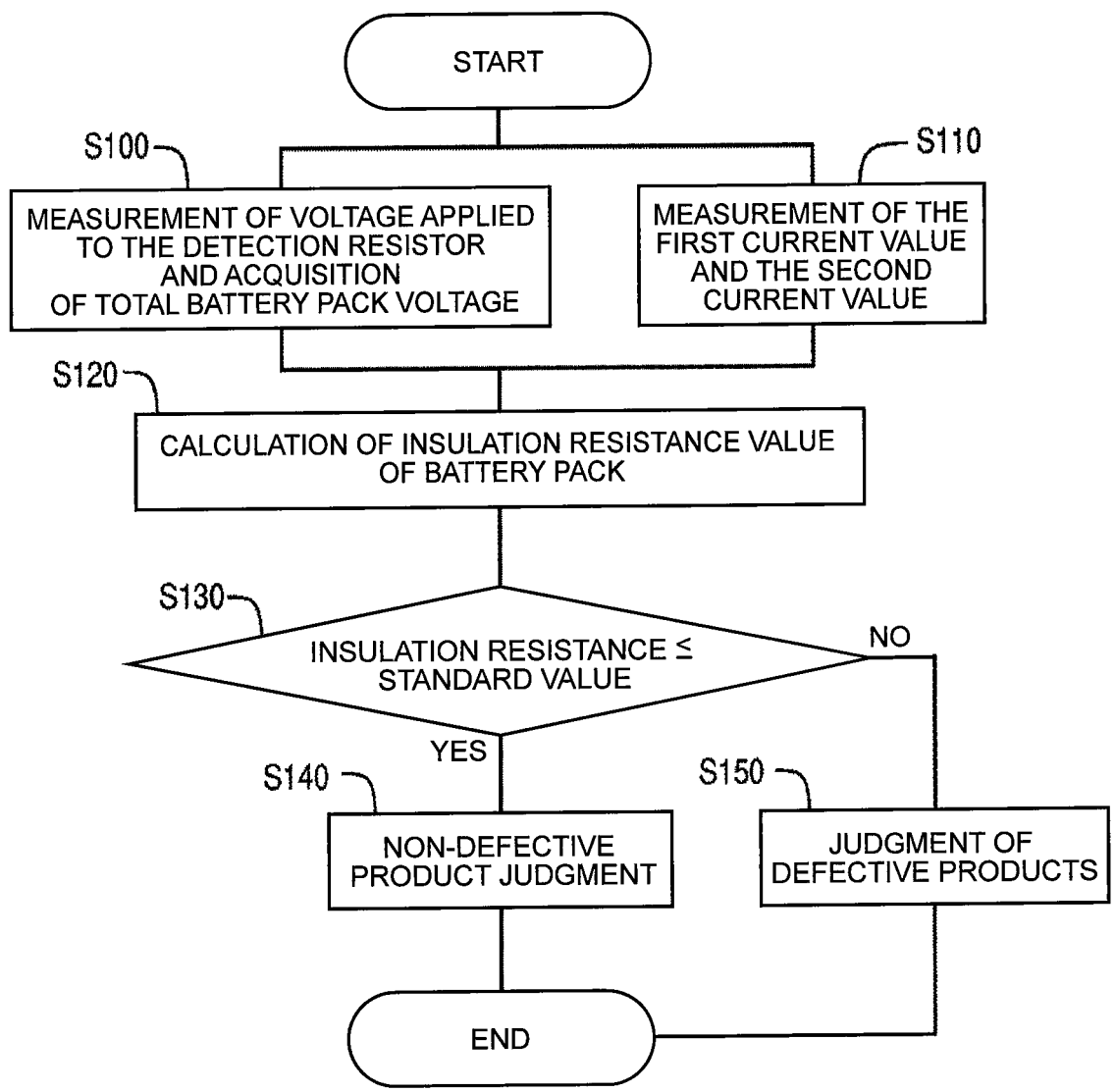
FIG. 3 is a flowchart illustrating a procedure of the insulation resistance testing method.

FIG. 3 is a flowchart showing a procedure of an insulation resistance testing method using the insulation resistance testing device 20. In S100 shown in the flowchart, the voltmeter 3 measures the voltage applied to the detection resistor 2. In addition, the rated value of the total voltage of the battery pack 1 is read or the measured value is measured. In S110, the first current value is measured by the first current sensor unit 11. The second current value is measured by the second current sensor unit 12. S100 process and S110 process are performed at the same time. However, S110 process can be performed after S100 process.

In S120, the resistance value of the insulation resistance 4 at the negative terminal of the battery pack 1 is calculated using the measured values obtained by S100 and S110. In S130, it is determined whether or not the insulation resistance value calculated by S120 is within the specification value. The standard value can be arbitrarily set.

When it is determined that the insulation resistance value is within the specification value, the process proceeds to S140. In S140, it is determined that the battery pack 1 having the insulation resistance value within the specification value is a non-defective product. On the other hand, when it is determined that the insulation resistance value is outside the specification value, the process proceeds to S150. In S150, it is determined that the battery pack 1 having the insulation resistance value outside the specification value is a defective product. According to such an inspection method, it is possible to quickly inspect whether or not the battery pack 1 is a non-defective product with respect to the insulation resistance.

Next, a specific circuit configuration of the current sensor units 11 and 12 applied to the insulation resistance testing device 20 will be described. A magnetic current sensor is used for the current sensor units 11 and 12. The mode of operation of the magnetic current sensor is not limited. However, when the magnetic current sensor is zero-point adjusted in a circuit having a low impedance circuit, the magnetic current sensor generates an electromotive force by a magnetic field generated by an external environment. Therefore, a deviation occurs at the zero point due to the current flowing by the electromotive force. The deviation of the zero point lowers the inspection accuracy of the insulation resistance.

Figure 4A:
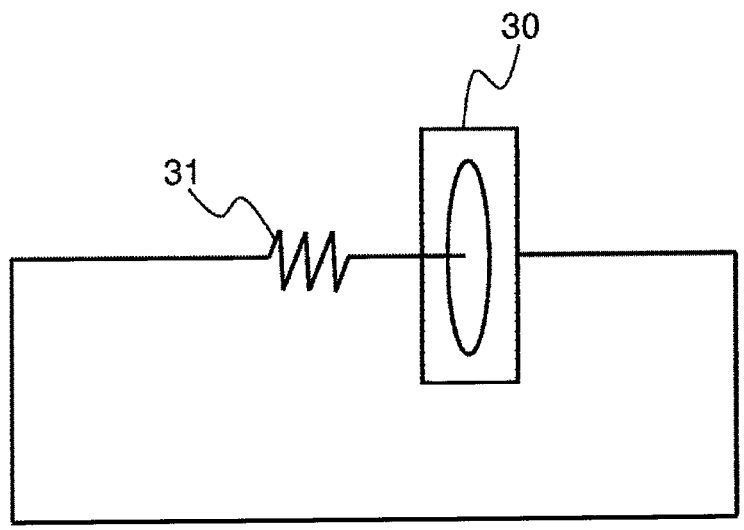
FIG. 4A is a circuit diagram illustrating an example of a circuit configuration of a current sensor unit.
Figure 4B:
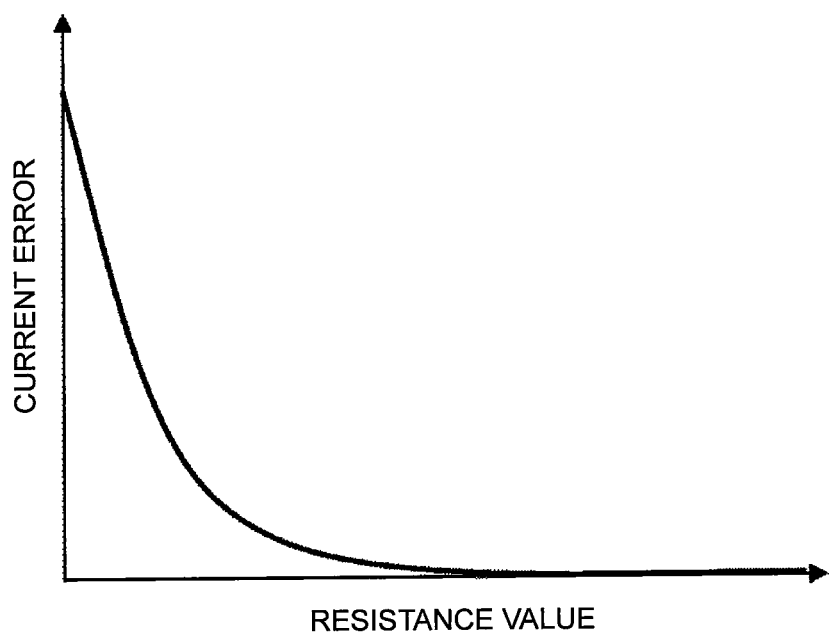
FIG. 4B is a graph showing the effectiveness of the present disclosure.

As shown in FIG. 4A, the magnetic current sensor 30 and the damping resistor 31 are arranged in series. By combining the damping resistor 31 with the magnetic current sensor 30 which does not use a resistor for measuring the current, it is possible to suppress the current from flowing by an external magnetic field. FIG. 4B is a graph showing the effectiveness obtained by the circuit configuration shown in FIG. 4A. As shown in this graph, as the resistance value of the damping resistor 31 is increased, the error of the current value with respect to the zero point becomes smaller. In the test, it was confirmed that the error of the current value is absolutely lowered by setting the resistance value to about 10Ω. Further, it was confirmed that if the resistance value is increased to about 30Ω, the error of the current value decreases to the order of 1 μA.

Figure 5A:
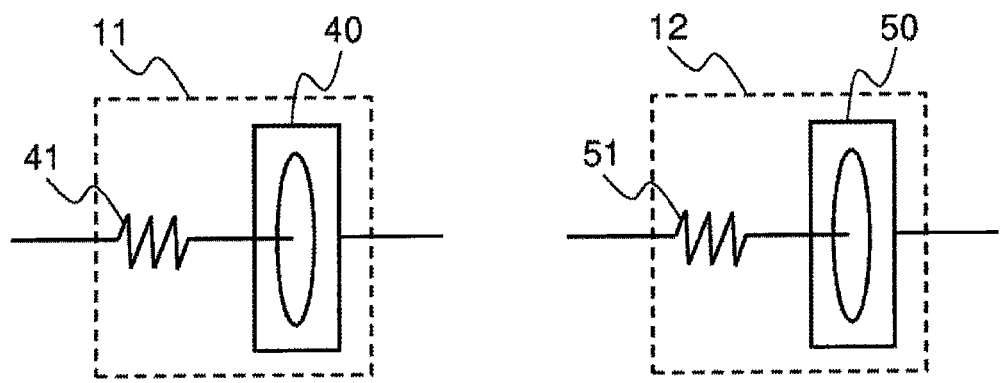
FIG. 5A is a circuit diagram of a first embodiment of a current sensor unit.

FIG. 5A is a circuit diagram showing a first embodiment of current sensor units 11 and 12 included in an insulation resistance testing device 20. The first current sensor unit 11 comprises a first magnetic current sensor 40 and a first damping resistor 41 arranged in series. The second current sensor unit 12 comprises a second magnetic current sensor 50 and a second damping resistor 51 arranged in series. The resistance value of each damping resistor 41, 51 can be set to any value as long as the error of the output value of the magnetic current sensor 40, 50 with respect to the zero point can be kept sufficiently low. By using the insulation resistance testing device 20 including the current sensor units 11 and 12 configured as described above for inspection, it is possible to improve the inspection accuracy of the insulation resistance while reducing the time required for the inspection of the insulation resistance.

Figure 5B:
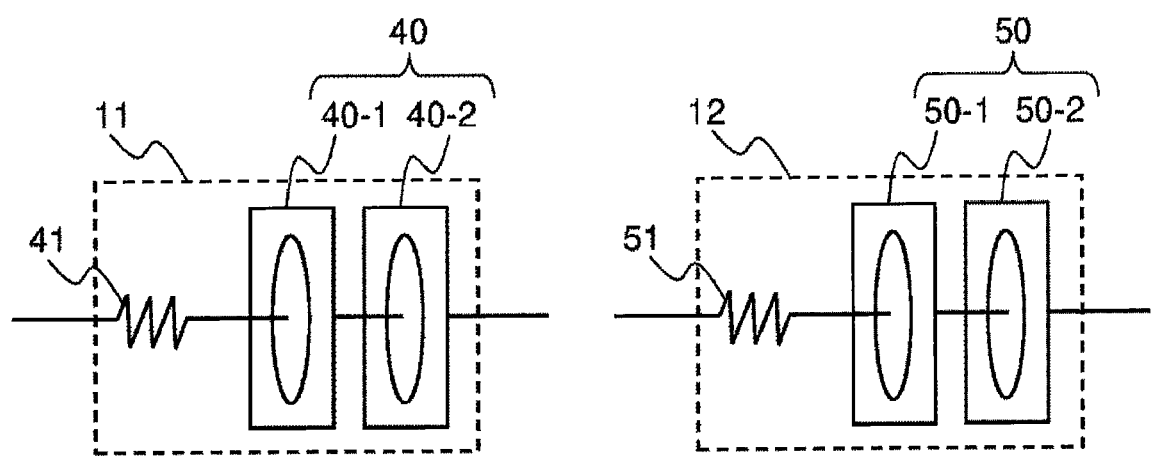
FIG. 5B is a circuit diagram of a second embodiment of a current sensor unit.

FIG. 5B is a circuit diagram showing a second embodiment of the current sensor units 11 and 12 included in the insulation resistance testing device 20. The first current sensor unit 11 comprises a first magnetic current sensor 40 and a first damping resistor 41 arranged in series. However, while the first magnetic current sensor 40 according to the first embodiment is a single magnetic current sensor, the first magnetic current sensor 40 according to the second embodiment is a set (first set) of two magnetic current sensors 40-1 and 40-2 arranged in series. The second current sensor unit 12 comprises a second magnetic current sensor 50 and a second damping resistor 51 arranged in series. However, while the second magnetic current sensor 50 according to the first embodiment is a single magnetic current sensor, the second magnetic current sensor 50 according to the second embodiment is a set (second set) of two magnetic current sensors 50-1 and 50-2 arranged in series.

By using the insulation resistance testing device 20 including the current sensor units 11 and 12 having the circuitry shown in FIG. 5A or 5B, it is possible to improve the inspection accuracy of the insulation resistance while shortening the duration required for the inspection of the insulation resistance. In particular, according to the insulation resistance testing device 20 including the current sensor units 11 and 12 having the circuit configuration shown in FIG. 5B, the insulation resistance of the battery pack 1 can be tested in FIG. 6.

According to the sequence shown in FIG. 6, in S200, the respective zero-point current values of the magnetic current sensors 40-1 and 40-2 are acquired in the first current sensor unit 11. In addition, a zero-point current value of each of the magnetic current sensors 50-1 and 50-2 is acquired in the second current sensor unit 12.

Next, in S210, the respective zeros of the magnetic current sensors 40-1 and 40-2 are adjusted in the first current sensor unit 11. In addition, in the second current sensor unit 12, the respective zero points of the magnetic current sensors 50-1 and 50-2 are adjusted. After the zeroing is completed, S220 is processed. In S220, the measurement of the resistance of the insulation resistance 4 on the negative terminal of the battery pack 1 is started in accordance with the process described with reference to FIG. 3.

In S230, the magnitude of the error between the current value $I_1$ measured by the magnetic current sensor 40-1 and the current value $I_2$ measured by the magnetic current sensor 40-2 in the first current sensor unit 11 is calculated. Then, it is determined whether or not the magnitude of the error is an allowable error. Similarly, the magnitude of the error between the current value $I_1$ measured by the magnetic current sensor 50-1 and the current value $I_2$ measured by the magnetic current sensor 50-2 in the second current sensor unit 12 is calculated. It is then determined whether the magnitude of the error is within the tolerance. The value of the tolerance can be set arbitrarily.

If the error in the current value between the magnetic current sensors in at least one of the first current sensor unit 11 and the second current sensor unit 12 exceeds the allowable error, the process proceeds to S260. In S260, it is determined that a measurement error has occurred in the insulation resistance testing device 20. In this case, the current sensor unit in which the measurement abnormality has occurred is replaced.

If the error of the current between the magnetic current sensors in both of the current sensor units 11, 12 is within the tolerance, the process proceeds to S240. In S240, it is determined whether or not the insulation resistance value calculated by S220 is within the specification value.

When it is determined that the insulation resistance value is within the specification value, the process proceeds to S250. In S250, it is determined that the battery pack 1 having the insulation resistance value within the specification value is a non-defective product. On the other hand, when it is determined that the insulation resistance value is outside the specification value, the process proceeds to S270. In S270, it is determined that the battery pack 1 having the insulation resistance value outside the specification value is a defective product. According to such an inspection method, it is possible to quickly and accurately inspect whether or not the battery pack 1 is a non-defective product with respect to the insulation resistance.

What is claimed is:

1. An insulation resistance testing device that tests an insulation resistance of a battery pack provided with a control unit including an electrolytic capacitor, the insulation resistance testing device comprising:
    a first magnetic current sensor disposed between the control unit and a ground;
    a first damping resistor disposed in series with a first magnetic current sensor between the control unit and the ground;
    a second magnetic current sensor disposed between a positive terminal of the battery pack and the ground; and
    a second damping resistor disposed in series with a second magnetic current sensor between the positive terminal and the ground,
    wherein the control unit, the first magnetic current sensor, and the first damping resistor are disposed inside the battery pack, and
    the second magnetic current sensor and the second damping resistor are disposed outside the battery pack.

2. The insulation resistance testing device according to claim 1, wherein:
    the first magnetic current sensor is a first set of a plurality of magnetic current sensors arranged in series; and
    the second magnetic current sensor is a second set of a plurality of magnetic current sensors arranged in series.

3. A method for testing an insulation resistance of the battery pack using the insulation resistance testing device according to claim 2, the method comprising:
    performing a zero point adjustment of each of the magnetic current sensors constituting the first set;
    performing a zero point adjustment of each of the magnetic current sensors constituting the second set;
    acquiring a first current value representing a current value measured by the magnetic current sensors constituting the first set when an error among current values measured by the magnetic current sensors constituting the first set is within an allowable error;
    acquiring a second current value representing a current value measured by the magnetic current sensors constituting the second set when an error among current values measured by the magnetic current sensors constituting the second set is within an allowable error; and
    calculating a resistance value of the insulation resistance of the battery pack based on a voltage value of the battery pack, the first current value, and the second current value.

4. A method for testing an insulation resistance of the battery pack using the insulation resistance testing device according to claim 1, the method comprising:
    performing a zero point adjustment of the first magnetic current sensor and performing a zero point adjustment of the second magnetic current sensor;
    acquiring a first current value measured by the first magnetic current sensor;

acquiring a second current value measured by the second magnetic current sensor; and calculating a resistance value of the insulation resistance of the battery pack based on a voltage value of the battery pack, the first current value, and the second current value.

\* \* \* \* \*